US006897476B1

United States Patent
Kim et al.

(12) United States Patent
(10) Patent No.: US 6,897,476 B1
(45) Date of Patent: May 24, 2005

(54) TEST STRUCTURE FOR DETERMINING ELECTROMIGRATION AND INTERLAYER DIELECTRIC FAILURE

(75) Inventors: Hyeon-Seag Kim, San Jose, CA (US); Seung-Hyun Rhee, Sunnyvale, CA (US); Christine S Hau-Riege, Fremont, CA (US); Amit P Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/636,162

(22) Filed: Aug. 7, 2003

(51) Int. Cl.[7] .................. H01L 23/58; H01L 21/4763; G01K 7/00; G01R 1/04
(52) U.S. Cl. ................ 257/48; 257/758; 257/774; 374/163; 374/164; 324/763; 324/765; 438/17; 438/18
(58) Field of Search ............... 257/48; 438/17, 438/18

(56) References Cited

U.S. PATENT DOCUMENTS 5,777,486 A * 7/1998 Hsu ...................... 324/763
6,293,698 B1 * 9/2001 Alvis ..................... 374/164
6,465,376 B2 * 10/2002 Uzoh et al. .............. 438/627
6,680,484 B1 * 1/2004 Young .................... 257/48

* cited by examiner

Primary Examiner—George Eckert
Assistant Examiner—Jesse Fenty
(74) Attorney, Agent, or Firm—Farjami & Farjami LLP

(57) ABSTRACT

According to one exemplary embodiment, a test structure for determining electromigration and interlayer dielectric failure comprises a first metal line situated in a metal layer of the test structure. The test structure further comprises a second metal line situated adjacent and substantially parallel to the first metal line, where the second metal line is separated from the first metal line by a first distance, and where the first distance is substantially equal to minimum design rule separation distance. The test structure further comprises an interlayer dielectric layer situated between the first metal line and the second metal line. According to this exemplary embodiment, electromigration failure is determined when a first resistance of the first metal line or a second resistance of the second metal line is greater than a predetermined resistance, and interlayer dielectric failure is determined when a first current is detected between the first and second metal lines.

9 Claims, 3 Drawing Sheets

TEST STRUCTURE FOR DETERMINING ELECTROMIGRATION AND INTERLAYER DIELECTRIC FAILURE

TECHNICAL FIELD

The present invention relates generally to the field of semiconductor devices. More particularly, the present invention relates to test structures in semiconductor devices.

BACKGROUND ART

The lifetime, i.e. time between first use and failure, of semiconductor dies can be approximated by test structures. Electromigration ("EM"), i.e. the transport of atoms in metals due to the "electron wind" effect, can cause failure in semiconductor dies due to the formation of "voids," i.e. open circuits, or "hillocks," i.e. extrusions causing short circuits, in metals.

EM test structures simulate the failure of devices due to the effects of electromigration. The National Institute of Standards and Technology ("NIST") has proposed a standard of 800.0 microns for EM test structure length. Conventional EM test structures-typically comprise a single metal line in a linear configuration having an EM test structure length of 800 microns. The single metal line is generally situated in a first metal layer of the conventional EM test structure, while test pads coupled to respective ends of the single metal line are typically situated in a second metal layer. An EM test can be performed by measuring a resistance of the single metal line. An EM failure can be determined when the measured resistance of the single metal line exceeds a predetermined resistance. However, conventional EM test structures capability of testing interlayer dielectric ("ILD") reliability.

Thus, there exists a need in the art for a test structure to efficiently determine EM failure and ILD failure.

SUMMARY

The present invention is directed to test structure for determining electromigration and interlayer dielectric failure. The invention addresses and resolves the need in the art for a test structure to efficiently determine EM failure and ILD failure.

According to one exemplary embodiment, a test structure for determining electromigration and interlayer dielectric failure comprises a first metal line situated in a metal layer of the test structure. The first metal line can have a length approximately equal to 800.0 microns, for example. The test structure further comprises a second metal line situated adjacent and substantially parallel to the first metal line, where the second metal line is separated from the first metal line by a first distance, and where the first distance is substantially equal to a minimum design rule separation distance. The first metal line and the second metal line may each have a width substantially equal to a minimum design rule width, for example. The first metal line and the second metal line may be, for example, copper or aluminum.

According to this exemplary embodiment, the test structure further comprises an interlayer dielectric layer situated between the first metal line and the second metal line. The interlayer dielectric layer may be, for example, a low-k dielectric layer. According to this exemplary embodiment, the electromigration failure is determined when a first resistance of the first metal line or a second resistance of the second metal line is greater than a predetermined resistance, and the interlayer dielectric failure is determined when a first current is detected between the first metal line and the second metal line.

The test structure further comprises a metal band surrounding the first metal line and the second metal line, where the interlayer dielectric layer being situated between the metal band and the first metal line and also between the metal band and the second metal line, and where the interlayer dielectric failure is determined when a second current is detected between the first metal line and the metal band or a third. current is detected between the second metal line and the metal band. The metal band can be situated a second distance from the first metal line and a third distance from the second metal line, where the second and third distances are substantially equal to the minimum design rule separation distance. Other features and advantages of the present invention will become more readily apparent to those of ordinary skill in the art after reviewing the following detailed description and accompanying drawings.

DETAILED DESCRIPTION OF THE INVENTION

The present invention is directed to test structure for determining electromigration and interlayer dielectric ("ILD") failure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
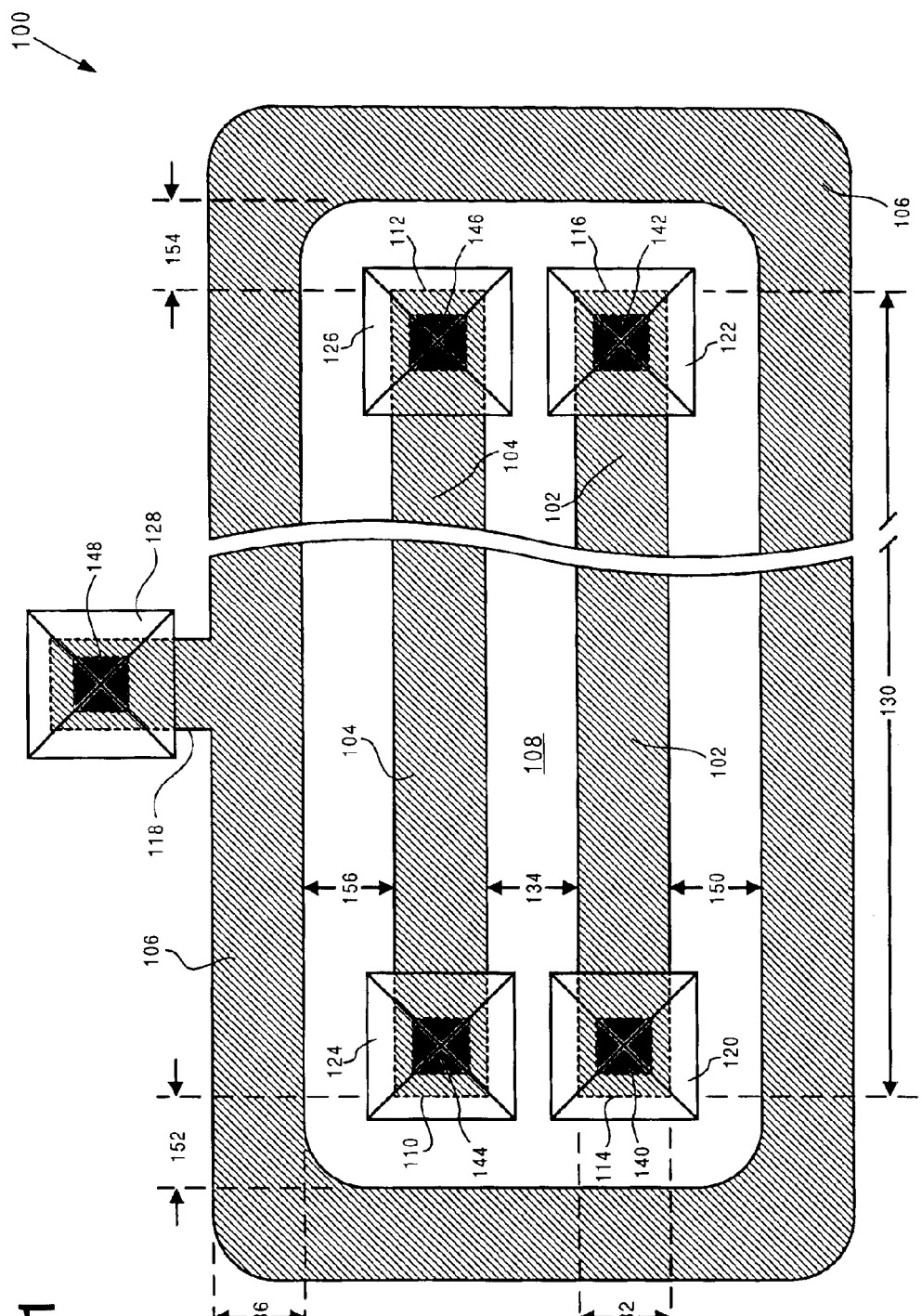
FIG. 1 illustrates a top view of an exemplary test structure in accordance with one embodiment of the present invention.

FIG. 1 shows a top view of test structure 100 formed in accordance with one embodiment of the invention. Certain details and features have been left out of FIG. 1 that are apparent to a person of ordinary skill in the art. Test structure 100 includes metal lines 102 and 104, metal band 106, ILD layer 108, and test pads 120, 122, 124,126, and 128. As shown in FIG. 1, metal line 102 can be situated in any desired metal layer of test structure 100, such as metal layer 1 (also referred to as M1), metal layer 2 (also referred to as M2), or any higher metal layer. Metal line 102 can comprise aluminum, copper, or other appropriate metal and can be fabricated by a deposition and patterning process. In the present embodiment, length 130 of metal line 102 can be approximately 800.0 microns. In other embodiments, length 130 can be greater or less than 800.0 microns. Width 132 of metal line 102 can be substantially equal to a minimum design rule width. By way of example, width 132 can be approximately 0.15 micron.

Also shown in FIG. 1, test pads 120 and 122 are situated over ends 114 and 116, respectively, of metal line 102 and are situated in a higher metal layer of test structure 100 than metal line 102. For example, if metal line 102 is situated in M1, test pads 120 and 122 can be situated in M2. Test pads 120 and 122 can comprises aluminum, copper, or other appropriate metal and can be fabricated by a deposition and patterning process. Test pads 120 and 122 are electrically connected to ends 114 and 116 of metal line 102 by vias 140 and 142, respectively. Vias 140 and 142 are formed in ILD layer 108 and can comprise, for example, tungsten, copper, or other appropriate metal. Test pads 120 and 122 can be utilized to measure a resistance of metal line 102 during an EM failure test and can also be utilized to detect current flow during an ILD failure test.

Further shown in FIG. 1, metal line 104 is situated adjacent to and substantially parallel to metal line 102 and is also situated in the same metal layer of test structure 100 as metal line 102. Metal line 104 is substantially similar in composition, width, length, and formation to metal line 102. Metal line 104 is separated from metal line 102 by distance 134, which can be substantially equal to a minimum design rule separation distance. By way of example, distance 134 can be approximately 0.15 micron. Also shown in FIG. 1, test pads 124 and 126 are situated over ends 110 and 112, respectively, of metal line 104 in the same metal layer of test structure 100 as test pads 120 and 122 and have a substantially similar composition and formation to test pads 120 and 122. Test pads 124 and 126 are electrically connected to ends 110 and 112 of metal line 104 by vias 144 and 146, respectively. Vias 144 and 146 are substantially similar in composition and formation to vias 140 and 142. Test pads 124 and 126 can be utilized to measure a resistance of metal line 104 during an EM failure test and can also be utilized to detect current flow during an ILD failure test.

Further shown in FIG. 1, metal band 106 is situated in the same metal layer of test structure 100 as metal lines 102 and 104 and is situated such metal band 106 completely surrounds metal lines 102 and 104. In the present embodiment, metal band 106 has a substantially similar composition and formation to metal lines 102 and 104. In the present embodiment, width 136 of metal band 106 is substantially equal to the width, i.e. width 132, of metal lines 102 and 104. In other embodiments, width 136 can be greater or less than width 132. In the present embodiment, metal band 106 has a rectangular shape comprising rounded inside and outside corners. In one embodiment, metal band 106 can have a rectangular shape comprising square inside and outside corners. Metal band 106 is separated from metal line 102 by distances 150, 152, and 154 and separated from metal line 104 by distances 152, 154, and 156. Distances 150, 152, 154, and 156 can be substantially equal to a minimum design rule separation distance. By way of example, distances 150, 152, 154, and 156 can be approximately 0.15 micron.

Also shown in FIG. 1, test pad 128 is situated over metal segment 118 in the same metal layer of test structure 100 as test pads 120, 122, 124, and 126 and has a substantially similar composition and formation to test pads 120, 122, 124, and 126. Test pad 128 is electrically connected to metal band 106 by via 148 and metal segment 118. Via 148 is similar in composition and formation to vias 140, 142, 144, and 146. Further shown in FIG. 1, ILD layer 108 is situated between metal band 106 and metal line 102, metal band 106 and metal line 104, and metal line 102 and metal line 104. ILD layer 108 is also situated over metal band 106 and metal lines 102 and 104. In the present embodiment, ILD layer 108 can comprise a dielectric having a low dielectric constant ("low-k dielectric"). In one embodiment, ILD layer 108 can be a high-k dielectric.

Figure 2:
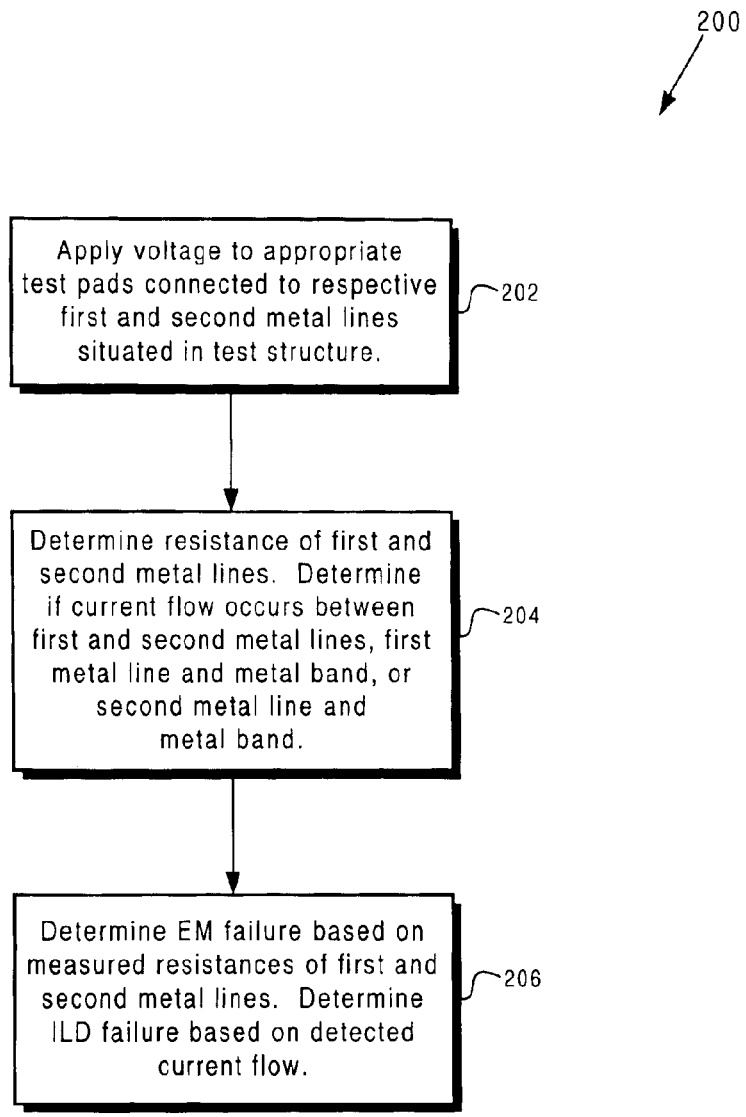
FIG. 2 is a flowchart corresponding to exemplary method steps according to one embodiment of the present invention.

Referring to FIG. 2, flowchart 200 illustrates an exemplary method according to an embodiment of the present invention. The following description of flowchart 200 includes references to test structure 100 of FIG. 1 since the method steps in flowchart 200 are implemented utilizing a test structure such as test structure 100. At step 202, a high voltage, such as 5.0 volts, is applied to test pads 122 and 124 of metal lines 102 and 104 and a low voltage, such as 0.0 volts, is applied to test pads 120 and 126 of metal lines 102 and 104, respectively. As a result, a current is caused to flow in a first direction in metal line 102 and a current is caused to flow in a second direction in metal line 104, where the first direction is opposed to the second direction. By applying, in this example, 5.0 volts to test pads 122 and 124 and 0.0 volts to test pads 120 and 126, a maximum strength electric field is created between metal lines 102 and 104 to provide maximum stress to the ILD layer, i.e. ILD layer 108, situated between metal lines 102 and 104. In other embodiments, voltages other than 5.0 volts can be applied to appropriate test pads of test structure 100 to create electric fields between metal lines 102 and 104 having respective desired strengths.

At step 204, a first resistance is determined by measuring resistance between test pads 120 and 122 of metal line 102 and a second resistance is determined by measuring resistance between test pads 124 and 126 of metal line 104. Current flow between metal lines 102 and 104 is determined by measuring current between test pad 120 or 122 of metal line 102 and test pad 124 or 126 of metal line 104, current flow between metal line 102 and metal band 106 is determined by measuring current between test pad 120 or 122 of metal line 102 and test pad 128 of metal band 106, and current flow between metal line 104 and metal band 106 is determined by measuring current between test pad 124 or 126 of metal line 104 and test pad 128 of metal band 106.

At step 206, each of the first and second resistances is compared with a predetermined resistance. An EM failure is indicated if the first or second resistance is greater than the reference resistance. An ILD failure is indicated if the respective current measured between metal lines 102 and 104, metal line 102 and metal band 106, or metal line 104 and metal band 106 is greater than approximately 0.0. In other words, an ILD failure is indicated if a current flow is detected between metal lines 102 and 104, metal line 102 and metal band 106, or metal line 104 and metal band 106. In one embodiment, an ILD failure can be determined by detecting an appropriate resistance between metal lines 102 and 104, an appropriate resistance between metal line 102 and metal band 106, or an appropriate resistance between metal line 104 and metal band 106. Thus, test structure 100 can be advantageously utilized to determine an EM failure and an ILD failure.

Figure 3:
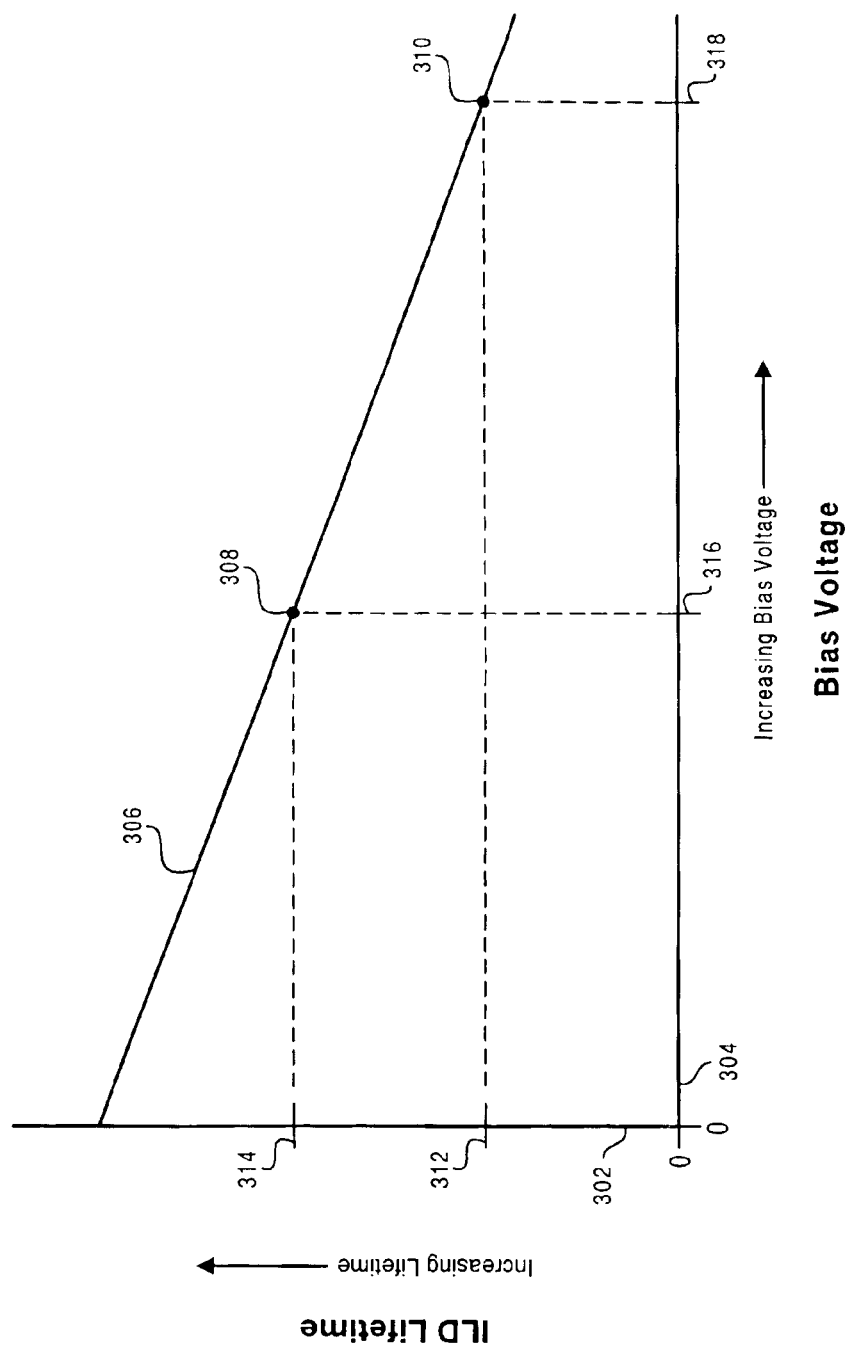
FIG. 3 is a graph showing an exemplary ILD lifetime line in accordance with one embodiment of the present invention.

FIG. 3 shows exemplary graph 300 including exemplary ILD lifetime line in accordance with one embodiment of the present invention. Graph 300 includes ILD lifetime axis 302 and bias voltage axis 304. Graph 300 also includes ILD lifetime line 306, which shows a relative change in ILD lifetime versus increasing bias voltage. ILD lifetime line 306 includes data points 308 and 310, which are determined by plotting ILD lifetimes 312 and 314 versus bias voltages 318 and 316, respectively. Data points, such as data point 308, can be determined by applying a respective bias voltage to metal line 102 or 104 in test structure 100 and recording the respective duration of time between application of the bias voltage and failure of ILD layer 108. Thus, ILD lifetime line 306 can be determined by utilizing test structure 100 to provide two or more data points, such as data points 308 and 310, and extending a line through the data points. ILD lifetime line 306 can be advantageously utilized to determine a projected lifetime of an ILD, such as ILD layer 108, at a desired bias voltage.

Thus, as discussed above, the present invention achieves a test structure that can be advantageously utilized to efficiently determine both EM failures and ILD failures. In contrast, a conventional EM test structure only has a capability of determining only EM failures. Additionally, the present invention achieves a flexible test structure that allows an ILD layer to be advantageously tested at a desired stress voltage. Furthermore, the present invention provides a test structure that can be advantageously utilized to determine a projected lifetime of an ILD layer at a desired bias voltage.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the segment lengths referred to in the present application can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a test structure for determining electromigration and interlayer dielectric failure has been described.

What is claimed is:

1. A test structure for determining electromigration and interlayer dielectric failure said test structure comprising:
    a first metal line situated in a metal layer of said test structure;
    a second metal line situated adjacent and substantially parallel to said first metal line, said second metal line being separated from said first metal line by a first distance, said first distance being substantially equal to a minimum design rule separation distance;
    a metal band surrounding said first metal line and said second metal line,
    an interlayer dielectric layer situated between said first metal line and said second metal line, said first metal line and said metal band, and said second metal line and said metal band;
    wherein said electromigration failure is determined when a first resistance of said first metal line or a second resistance of said second metal line is greater than a predetermined resistance, and wherein said interlayer dielectric failure is determined when a first current is detected between said first metal line and said second metal line.

2. The test structure of claim 1 wherein said interlayer dielectric failure is determined when a second current is detected between said first metal line and said metal band or a third current is detected between said second metal line and said metal band.

3. The test structure of claim 1 wherein said first metal line has a first width and said second metal line has a second width, said first width and said second width being substantially equal to a minimum design rule width.

4. The test structure of claim 1 wherein said first metal line comprises a second current flowing in a first direction and said second metal line comprises a third current flowing in a second direction, wherein said first direction is opposed to said second direction.

5. The test structure of claim 1 wherein said interlayer dielectric layer comprises a low-k dielectric.

6. A test structure for determining electromigration and interlayer dielectric failure, said test structure comprising:
    a first metal line situated in a metal layer of said test structure;
    a second metal line situated adjacent and substantially parallel to said first metal line, said second metal line being separated from said first metal line by a first distance, said first distance being substantially equal to a minimum design rule separation distance;
    an interlayer dielectric layer situated between said first metal line and said second metal line;
    a metal band surrounding said first metal line and said second metal line, said interlayer dielectric layer being situated between said metal band and said first metal line and between said metal band and said second metal line;
    wherein said electromigration failure is determined when a first resistance of said first metal line or a second resistance of said second metal line is greater than a predetermined resistance, and wherein said interlayer dielectric failure is determined when a first current is detected between said first metal line and said second metal line, a second current is detected between said first metal line and said metal band, or a third current is detected between said second metal line and said metal band.

7. The test structure of claim 6 wherein said metal band is situated a second distance from said first metal line and a third distance from said second metal line, said second distance and said third distance being substantially equal to said minimum design rule separation distance.

8. A test structure for determining electromigration and interlayer dielectric failure, said test structure comprising a first metal line situated in a metal layer of said test structure, said test structure being characterized by:
    a second metal line situated adjacent and substantially parallel to said first metal line, said second metal being separated from said first metal line by a first distance, said first distance being substantially equal to a minimum design rule separation distance, an interlayer dielectric layer situated between said first metal line and said second metal line, a metal band surrounding said first metal line and said second metal line, said interlayer dielectric layer being situated between said metal band and said first metal line and between said metal band and said second metal line, wherein said electromigration failure is determined when a first resistance of said first metal line or a second resistance of said second metal line is greater than a predetermined resistance, and wherein said interlayer dielectric failure is determined when a first current is detected between said first metal line and said second metal line, a second current is detected between said first metal line and said metal band, or a third current is detected between said second metal line and said metal band.

9. The test structure of claim 8 wherein said metal band is situated a second distance from said first metal line and a third distance from said second metal line, said second distance and said third distance being substantially equal to said minimum design rule separation distance.

* * * * *